(12) United States Patent
Demasius et al.

(10) Patent No.: US 12,205,637 B2
(45) Date of Patent: Jan. 21, 2025

(54) CAPACITIVE SYNAPTIC COMPONENT AND METHOD FOR CONTROLLING SAME

(71) Applicant: SEMRON GMBH, Dresden (DE)

(72) Inventors: Kai-Uwe Demasius, Dresden (DE); Aron Kirschen, Dresden (DE)

(73) Assignee: SEMRON GMBH, Dresden (DE)

(*) Notice: Subject to any disclaimer, the term of this patent is extended or adjusted under 35 U.S.C. 154(b) by 808 days.

(21) Appl. No.: 17/310,267

(22) PCT Filed: Nov. 23, 2020

(86) PCT No.: PCT/EP2020/083085
§ 371 (c)(1),
(2) Date: Jul. 27, 2021

(87) PCT Pub. No.: WO2021/099639
PCT Pub. Date: May 27, 2021

(65) Prior Publication Data
US 2022/0059161 A1 Feb. 24, 2022

(30) Foreign Application Priority Data

Nov. 21, 2019 (DE) .......................... 102019008095.5
Apr. 29, 2020 (EP) ..................................... 20172069

(51) Int. Cl.
*G11C 11/54* (2006.01)
*G06N 3/048* (2023.01)
(Continued)

(52) U.S. Cl.
CPC .............. *G11C 11/54* (2013.01); *G06N 3/048* (2023.01); *G06N 3/065* (2023.01); *G11C 11/221* (2013.01);
(Continued)

(58) Field of Classification Search
CPC ................................ G11C 11/54; G06N 3/065
(Continued)

(56) References Cited

U.S. PATENT DOCUMENTS

| 5,146,542 A | 9/1992 | Engeler |
| 5,524,092 A | 6/1996 | Park |

(Continued)

FOREIGN PATENT DOCUMENTS

| DE | 102014105639 B3 | 3/2015 |
| WO | 1991018360 A1 | 11/1991 |

(Continued)

OTHER PUBLICATIONS

Ferroelectri cMemory Capacitors for Neura lNetworks NTIS Tec hNotes, US Department of Commerce,Sep. 1, 1991,Springfield,VA,US. *

(Continued)

*Primary Examiner* — Muna A Techane
(74) *Attorney, Agent, or Firm* — Nicholas Mesiti; HESLIN ROTHENBERG FARLEY & MESITI P.C.

(57) ABSTRACT

A capacitive synaptic component consisting of a layered structure composed of a gate electrode, having a first dielectric layer connected to the gate electrode, a second dielectric layer and a readout electrode connected to the second dielectric layer, and an intermediate layer arranged between the first dielectric layer and the second dielectric layer. A method for writing and reading the component is also disclosed. The component addresses a high capacitive deviation ratio without changing the plate spacing, the surface area or the relative permittivity or limiting the lateral scalability by the intermediate layer having adjustable shielding behaviour in an electric field, proceeding from the gate electrode towards the readout electrode, and the intermediate layer having one or more suitable contacts that produce (Continued)

Figure 1:
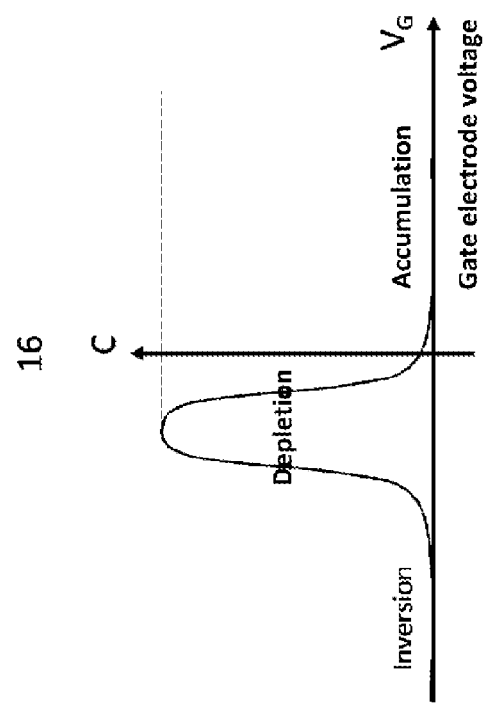
Figure 1:
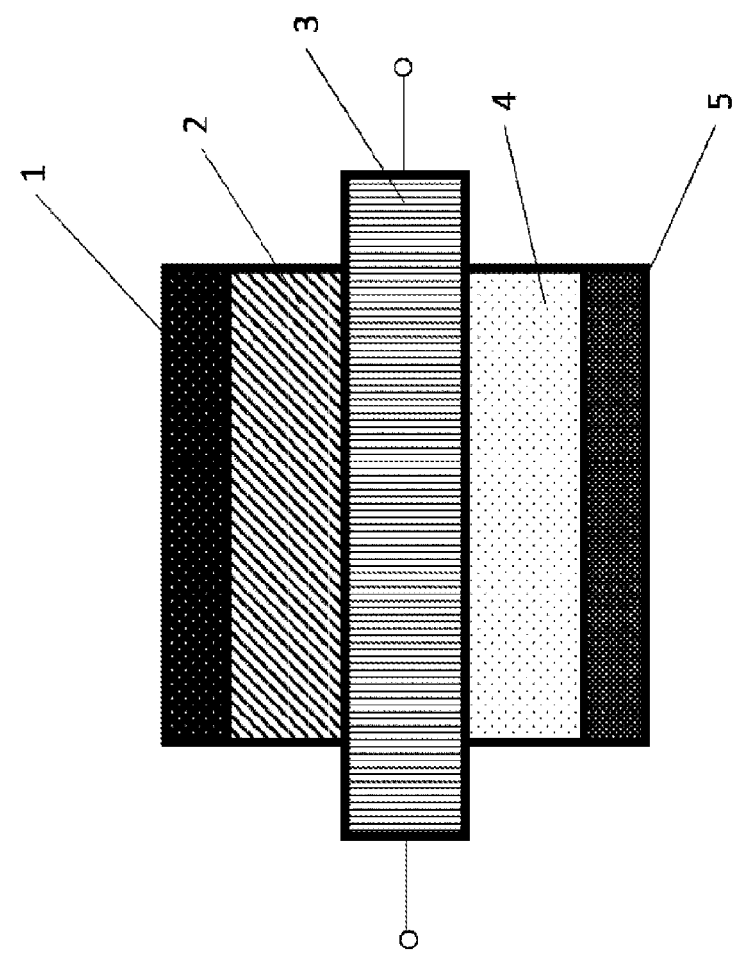

a charge flow into or a charge flow out of the intermediate layer.

20 Claims, 11 Drawing Sheets

(51) Int. Cl.
   *G06N 3/065* (2023.01)
   *G11C 11/22* (2006.01)
   *H10B 53/30* (2023.01)
(52) U.S. Cl.
   CPC ...... *G11C 11/2273* (2013.01); *G11C 11/2275* (2013.01); *H10B 53/30* (2023.02)
(58) Field of Classification Search
   USPC .......................................................... 706/15
   See application file for complete search history.

(56) References Cited

U.S. PATENT DOCUMENTS

| | | | |
|---|---|---|---|
| 2003/0142533 A1* | 7/2003 | Ueda | H10B 53/00 |
| | | | 257/E29.302 |
| 2004/0006545 A1* | 1/2004 | Ovhsinsky | G11C 11/54 |
| | | | 706/31 |
| 2012/0014170 A1 | 1/2012 | Strukov et al. | |
| 2018/0019011 A1 | 1/2018 | Park et al. | |
| 2018/0082168 A1 | 3/2018 | Marukame et al. | |
| 2018/0166448 A1 | 6/2018 | Cheng et al. | |
| 2018/0226453 A1* | 8/2018 | Yi | H10N 70/826 |
| 2018/0268970 A1 | 9/2018 | Ham et al. | |
| 2019/0303744 A1 | 10/2019 | Yang et al. | |
| 2020/0293855 A1* | 9/2020 | Le Gallo-Bourdeau | |
| | | | G06N 3/084 |
| 2021/0150326 A1* | 5/2021 | Grollier | G06N 3/065 |

FOREIGN PATENT DOCUMENTS

| | | |
|---|---|---|
| WO | 2010147588 A1 | 12/2010 |
| WO | 2011025495 A1 | 3/2011 |
| WO | 2016068886 A1 | 5/2016 |
| WO | 2018069359 A1 | 4/2018 |

OTHER PUBLICATIONS

Min Hyuk Park et al.,"Tristate Memory Using Ferroelectric-Insulator-Semiconductor Hetero junctions fo r50% Increased Data Storage" Advanced Functional Materials,Wiley-VCH Verlang GmbH &Co. ,Germany,Nov. 22,2021, pp. 4305-4313.*
Mlassimiliano Di Ventra e tal.,"Circuit elements with memory:memristors, me capacitors and meminductors" EEE,Jan. 23, 2009,pp. 1-6.*
International Search Report issued in PCT/EP2020/083085 and mailed Feb. 24, 2021.
"Ferroelectric Memory Capacitors for Neural Networks" NTIS Tech Notes, US Department of Commerce, Sep. 1, 1991, Springfield, VA, US.
Massimiliano Di Ventra et al., "Circuit elements with memory: memristors, memcapacitors and meminductors" IEEE, Jan. 23, 2009, pp. 1-6.
International Preliminary Report on Patentability issued in PCT/EP2020/083085 dated May 17, 2022.

* cited by examiner

CAPACITIVE SYNAPTIC COMPONENT AND METHOD FOR CONTROLLING SAME

CROSS REFERENCE TO RELATED APPLICATIONS

This application is the National Phase filing under 35 U.S.C. § 371 of International Application No.: PCT/EP2020/083085, filed on Nov. 23, 2020, which claims priority to German Application No.: 102019008095.5 filed on Nov. 21, 2019, and European Application No. 20172069.5 filed on Apr. 29, 2020. The contents of this prior application is hereby incorporated by reference herein in its entirety.

The invention relates to a capacitive synaptic component, consisting of a layer structure composed of a gate electrode, comprising a first dielectric layer connected to the gate electrode, a second dielectric layer and a readout electrode connected to the second dielectric layer and an intermediate layer arranged between the first dielectric layer and the second dielectric layer, consisting of conducting material, semiconducting material, insulating material or graphene.

The invention also relates to an arrangement using a capacitive synaptic component and to a method for writing to and reading from a capacitive synaptic component according to the invention.

BACKGROUND ART

A capacitive synaptic component is understood to mean a capacitive component for weighted multiplication in artificial neural networks.

Artificial neural networks have acquired increasing importance in image and object recognition and data processing in recent years and in the future will have an important relevance in the implementation of artificial intelligence.

Artificial neural networks are biologically inspired and consist of neurons in which the processing of information takes place, and said neurons are linked with many further neurons via weighted connections (so-called synapses). In this case, the output signal of a neuron is either greatly attenuated in such a link or transmitted well to the next neuron, wherein this synaptic link has a plasticity, that is to say can be strengthened or weakened in a graded manner. The input signals of a neuron following the weighting are summed, and integrated over time in the case of biological neural networks, and said neuron fires out a new signal upon a threshold value being reached. In so-called multilayer perceptrons, the input signals of a neuron are also summed, but nonlinearly distorted there, e.g. in the form of a sigmoidal function or hyperbolic tangent function or a rectified linear unit (ReLU).

The problem of present-day computer architectures is that for the most part they are based on the so-called von Neumann architecture with a strict separation between memory and processor, and that quite a large number of multiplications with summations are necessary for calculating artificial neural networks. The synaptic weighting ultimately constitutes a multiplication by a weight and the summation is effected at the neuron inputs. Since not all of the weights can be stored in proximity to the processor, they generally have to be loaded from the main memory into the processor and then multiplied and summed, which is extremely energy-intensive.

For this reason, in recent years various neuromorphic computer architectures have been developed with the intention of enabling an energy-efficient implementation of artificial neural networks. By way of example, matrix structures in which the weights are stored are particularly suitable since the weighting of artificial neural networks can be regarded as vector-matrix multiplication. In this case, the input vectors applied to the word lines of a matrix correspond to the output signals of a layer of neurons and these are multiplied at the crossover points of the matrix, in which the weights are stored as quasi analog values, and the signals are summed on the bit line. The summed output signal on the bit lines is connected to the next layer of neurons (Tsai et al.: Recent progress in analog memory-based accelerators for deep learning).

Examples for implementing the weighting in a matrix include resistive memory components, such as memristors (US20180019011A1), phase change memory or floating gate transistors. In the case of resistive memory components, the multiplication is effected here by way of Ohm's law: $I=G\times U$, wherein the voltage U is the input on the word line and G is the freely adjustable conductance of the resistive memory component. The current I is summed on the bit line. In this way, the calculation takes place directly in the memory and the data transfer, as in the von Neumann architecture, is obviated.

An essential disadvantage of resistive components is that they have a power loss. For this reason, the implementation with capacitive components is advantageous since the latter ideally have only a reactive power and do not have a static power consumption (Di Ventra et al.: Circuit elements with memory-memristors, memcapacitors, and meminductors, Proceedings of the IEEE or WO2016068886A1, U.S. Pat. No. 5,146,542A, WO1991018360A1).

Various components for implementing such memcapacitive components have already been proposed.

What most memcapacitive components have in common is that the capacitance is adjusted by way of the equation $C=\varepsilon_r \varepsilon_0 \cdot A/d$ and components can be subdivided into those which utilize a variation of the plate spacing d, of the area A or the relative permittivity $\varepsilon_r$.

Examples of components with variation of the plate spacing d are memristor-like components, wherein the doping front of oxygen vacancies manipulates the plate spacing of a capacitor (US20120014170A1, WO2011025495A1). Micromechanical components have likewise been published (Emara et al.: Non-volatile low-power crossbar memcapacitor-based memory), wherein the plate spacing is adjusted mechanically. A metal-ferroelectric-semiconductor-metal layer structure can also serve as a component with variation of the plate spacing d, wherein the depletion layer width in the semiconductor is adjusted in a nonvolatile manner by means of the polarization state of the ferroelectric (DE102014105639B3, U.S. Pat. No. 5,524,092A1, Min et al.: Tristate Memory Using Ferroelectric-Insulator-Semiconductor Heterojunctions for 50% Increased Data Storage). The depletion layer width variation is accompanied by a variation of the plate spacing.

One example of a component with area variation has been published in US2019303744A1 or Wang et al.: Capacitive neural network with neuro-transistors. The publication encompasses memristors with a parallel parasitic capacitance and a series capacitance, wherein the parallel parasitic capacitance must have a significantly low capacitance than the series capacitance, which is realized by means of a small area in the example mentioned. The parasitic capacitance is short-circuited by the memristor if a high total capacitance has to be set. Examples of components with variation of the relative permittivity are found in Zheng et al.: Artificial Neural Network Based on Doped HfO2 Ferroelectric Capacitors with Multilevel Characteristics or Driscoll et al.: Memory metamaterials. The concepts are entirely based on components on the basis of ions (Krems et al.: Ionic Memcapacitive Effects in Nanopores) or the tunnel effect (Martinez et al.: Solid-state memcapacitor).

Since it would be desirable to achieve the highest possible ratio of minimum and maximum capacitance (dynamic ratio) in a synaptic component in order to be able to store as many capacitance values as possible, it is necessary to achieve a high contrast between minimum and maximum plate spacings d in the case of components with a variable plate spacing. A problem here is that a very large d for the minimum capacitance would limit the lateral scaling with respect to small technology nodes of the component. Stray coupling in the case of a large plate spacing d with respect to neighboring cells is dominant and undesired. On the other hand, a very small d for the maximum capacitance would result in very large tunneling currents between the capacitance plates. By way of example, in the case of a swing ratio between minimum and maximum capacitance of >1:100 and a maximum thickness d of 30 nm, it would be necessary to set a minimum thickness of 0.3 nm for the maximum capacitance. In the case of such thicknesses, direct tunneling occurs and the advantage of a low power loss in capacitive components would be nullified.

A varied plate size A would likewise have a lateral scaling problem and a variation of the relative permittivity $\varepsilon_r$ limits the material selection, or is possible only with a low dynamic swing ratio.

Patent WO002018069359A1 has already presented a capacitive matrix structure having a layer with a variable shielding length, but it serves principally for storing digital information, and said patent described methods as to how individual memory cells can be selected, which is less relevant for neuromorphic applications.

A memory cell including ferroelectric dielectrics and the manufacturing method thereof are described in US 2018/0166448. Even though this memory cell differs from the present invention with regard to objective and function, a physical structure which is comparable with the structure according to the invention is described therein. For this reason, this prior art is taken as a basis hereinafter. The patent describes an improved DRAM memory, wherein the speed in a FinFET is increased by means of a ferroelectric in the gate dielectric and, secondly, retention is optimized by means of lower sub-threshold leakage currents (negative capacitance). However, this technical solution does not describe a variable capacitance with a nonvolatile memory effect, but contains the following layer structure: first metal layer—buffer layer—ferroelectric layer—layer with charge traps—insulating layer—second metal layer. The layer with charge traps can consist of a conducting material, a semiconducting material, an insulating material or graphene. This layer does not function as a shielding layer in this context, however, but rather as a further storage layer alongside the ferroelectric. A good shielding layer would have to enable rapid charge carrier transfer, which is not possible with the layer in US 2018/0166448 since this layer is potential-free/floating and charge carrier transfer, if possible at all, is possible only slowly by way of the tunnel effect.

Synaptic components that will likewise become highly relevant in the future will have not just two terminals but rather an additional modulation terminal in order to vary links depending on the activity of a further variable. Such possibilities have been presented hitherto only for resistive components (Yang et al.: Memristive Physically Evolving Networks Enabling the Emulation of Heterosynaptic Plasticity).

Furthermore, besides weighted multiplication by fixed weights, multiplications between totally variable variables also play a part in artificial neural networks. However, multiplications between analog voltage values require a complex analog circuit and it would be expedient to carry out such a multiplication, in a manner similar to weighted multiplication, with a single electronic component.

It is an object of this invention to specify a capacitive synaptic component with a plurality of nonvolatile memory states which enables a high capacitive swing ratio, without in this case varying the plate spacing, the area or the relative permittivity, or without limiting the lateral scalability. Moreover, there ought to be a further modulation terminal.

SUMMARY OF THE INVENTION

According to the invention, this object is achieved in respect of the arrangement by means of a capacitive synaptic component having the features of claim 1.

Embodiments in respect thereof are presented in dependent claims 2 to 10.

The object is also achieved by means of the use of the component according to the invention in an arrangement as claimed in claim 11.

Furthermore, the stated object according to the invention is achieved by a method as claimed in claim 12. Configurations in respect of the method are presented in dependent claims 13 to 16.

A capacitive synaptic component of the type mentioned in the introduction is configured according to the invention in that the intermediate layer is embodied as a layer having adjustable shielding behavior in an electric field, proceeding from the gate electrode in the direction toward the readout electrode, and the intermediate layer is provided with one or more dedicated contacts that realize a charge inflow into or a charge outflow out of the intermediate layer.

The electric field lines from the gate electrode will either end on or in the intermediate layer in the case of strong shielding of the intermediate layer; in the case of weak shielding, the field lines end principally on the readout electrode. That is to say that a through coupling of the electric field from the gate electrode to the readout electrode is controlled by the shielding of the intermediate layer. A high swing ratio is primarily ensured by an effective shielding of the intermediate layer, such that the electric field is virtually completely interrupted. This is a fundamental difference visa vis the prior art mentioned in the introduction, in which the swing ratio is achieved e.g. by means of a variation of the capacitor plate spacing, with the disadvantages mentioned. Here a sufficiently high dynamic ratio can be achieved even with thin layers, which allows a better lateral scalability. Moreover, the component has a third terminal at the intermediate layer, which enables a further modulation.

Expediently, provision is made for the first dielectric layer and/or the intermediate layer to be embodied as an active storage medium. The strength of the shielding of the intermediate layer can be stored in a nonvolatile fashion, either by the intermediate layer itself having a storage function, and/or with an interplay between the first dielectric layer and the intermediate layer, the storage function coming from the first dielectric layer.

The first dielectric layer can be embodied as an active storage medium storing different charge states.

A dielectric layer which can store different charge states shifts the voltage point of the shielding in the intermediate layer, that is to say that, for example, capacitance-gate voltage curves in an intermediate layer composed of a semiconductor can be shifted by the charge states. The charge states are stored in a nonvolatile fashion.

In one embodiment in this respect it is provided that the first dielectric layer in the function as an active storage medium consists of a ferroelectric material.

A ferroelectric material has electrical polarization states which can be adjusted arbitrarily between a positive and negative polarization by domain formation.

In the case where the first dielectric layer is embodied as an active storage medium storing different charge states, the first dielectric layer in the function as an active storage medium can have charge traps.

Charge traps can be embodied for example by a nitride layer or a polycrystalline layer in the first dielectric layer. The charges are trapped in a nonvolatile fashion in the layer.

If the first dielectric layer and/or the intermediate layer are/is embodied as an active storage medium, it can be provided that the intermediate layer is embodied as an active storage medium storing different resistance values by virtue of the fact that the intermediate layer has a variable resistance, and it can be embodied so as to store its resistance value in a nonvolatile manner.

Besides the first dielectric layer, therefore, the intermediate layer itself can also have a nonvolatile storage function. A high resistance results in a low inflow of shielding charges and thus a transmission of the electric field from the gate electrode to the readout electrode. A low resistance of the intermediate layer results in a strong shielding.

In this case, it is possible for the intermediate layer to consist of a metal-insulator junction material, a memristive material or a phase-change memory.

A metal-insulator junction has been observed in vanadium dioxide, for example, wherein a band gap can be closed and opened (e.g. by way of temperature, pressure, optically or electric fields). This results in a varied mobile charge carrier concentration and thus shielding. In a memristive material (e.g. titanium dioxide or tantalum oxide), the resistance is varied by means of mobile oxygen vacancies. In a phase-change memory material, a phase change takes from an amorphous phase to a crystalline phase takes place, which is accompanied by a change in resistance.

In a further embodiment, it can be provided that the intermediate layer consists of a semiconductor material and has a nonlinearity in a capacitance-voltage ratio of a capacitive coupling between gate electrode and readout electrode.

A semiconductor material is well suited as an intermediate layer in order to achieve an alternating shielding. If the semiconductor is operated in inversion or accumulation by way of the gate voltage, the shielding is very strong; in the case of full depletion, the field couples through to the readout electrode, and the shielding is weak. A capacitive coupling window thus arises for a specific gate voltage range. Since the inversion and accumulation layers are very thin, primarily in the case of strong inversion and accumulation, respectively, the semiconductor layer can likewise be made thin and a high dynamic swing ratio can nevertheless be achieved, which constitutes a significant difference with respect to DE102014105639B3 and U.S. Pat. No. 5,524, 092A1.

In a further embodiment variant, it can be provided that the intermediate layer has lateral highly doped p-type and n-type zones, and the intervening region is only weakly doped or intrinsic, with formation of a lateral psn or pin zone.

The lateral doped p-type and n-type zones enable an injection of holes and electrons and thus good inversion and accumulation of the semiconductor zone. Symmetrical shielding behavior with regard to positive and negative gate voltages is achieved as a result. Symmetrical behavior is essential in synaptic components in order to achieve high accuracy (Tsai et al.: Recent progress in analog memory-based accelerators for deep learning). In addition, the psn or pin junction opens up a further possibility for modulation by applying a lateral voltage difference. The s in psn is intended to denote a weak doping in comparison with the p-type and n-type zones.

Furthermore, it can be provided that there is arranged between the first dielectric layer and the readout electrode (5) a semiconductor region having a first partial region, which forms the intermediate layer, and a second partial region, which is provided with a charge carrier depletion, such that it forms the second dielectric layer.

A depleted semiconductor can be regarded as an approximately dielectric layer, and so it can form the second dielectric layer. The intermediate layer and the second dielectric layer thus consist of a continuous semiconductor zone, wherein the dielectric layer is characterized by a depletion. In this case, the readout electrode can be embodied by a doped semiconductor zone underneath or by a metal zone on the semiconductor underside. An advantage of this arrangement is that the intermediate layer and the second dielectric layer can consist of a continuous semiconductor material, which allows simpler fabrication.

With an arrangement using a capacitive synaptic component according to the invention, the way in which the stated object according to the invention is achieved is that a matrix consists of a plurality of capacitive synaptic components in which, from each capacitive synaptic component, the word line is connected to the gate electrode, the readout electrode is connected to the bit line and the intermediate layer is connected to a shielding line, wherein, in the case of laterally doped zones, shielding lines are present for each doped zone, wherein the shielding line is embodied in a manner corresponding to the bit line, and the bit lines form an angle of not equal to zero, preferably 90°, with respect to the word lines.

For the calculation of artificial neural networks, many vector-matrix multiplications have to be carried out, the weights being situated in the matrix. For this purpose, it is advantageous to arrange the synaptic components in a matrix. In this case, the gate electrodes of the capacitive synaptic component described above are connected to word lines, the readout electrodes are connected to bit lines and the terminals of the intermediate layer are connected to shielding lines. In this case, the shielding lines are arranged parallel to the bit lines, which are in turn arranged perpendicular to the word lines. The input signal, that is to say the values of the vectors which are weighted (depending on the adjusted shielding) in the capacitive synaptic components, is applied to the word lines and the summed result is read out on the bit lines. The writing is effected between the shielding line and the word line.

The way in which the stated object according to the invention is achieved in respect of the method for writing to and reading from a capacitive synaptic component according to the invention consists in the following steps defined on a case by case basis:

a. in the event of a nonvolatile adjustment of the shielding a write voltage is applied between the gate electrode and the intermediate layer and it is possible to achieve graded writing in the form of the adjustment of different electrical states of the active storage medium either by way of a varying write pulse height, write pulse duration or write pulse number.

That is to say that a potential difference is present between gate electrode and intermediate layer and charge states can be stored in the first dielectric, for example. In the case of charge traps, the charges would be injected by quantum mechanical tunneling, for example. In the case of a ferroelectric, this can be effected by changing the polarization state. In the case of an adjustable resistance in the intermediate layer, the writing is effected for example by bringing about a metal-insulator junction or movement of oxygen vacancies. In this case, the different states can be adjusted either by varying the write pulse duration, by varying the write pulse height or by varying the write pulse number, that is to say that quasi-analog value storage is achieved.

b. In the event of a volatile adjustment of the shielding on a case by case basis at the intermediate layer a DC voltage or a symmetrical reverse or forward voltage is applied to the pin or psn junction.

Besides the nonvolatile adjustment of the shielding, the latter can also be adjusted in a volatile fashion by means of a voltage at the intermediate layer. In the case of lateral p-type and n-type zones, a reverse or forward direction at the lateral pin or psn diode can cause depletion or enhancement of mobile charge carriers and thus adjust a shielding. Moreover, applying an identical DC voltage to the terminals of the intermediate layer, in the case of a semiconductor material, can cause a shift of the gate voltage range of the depletion and thus adjust a shielding/transmission (shift of capacitance-voltage curves).

c. In case a) the intermediate layer is grounded during readout of the capacitive coupling between gate electrode and readout electrode, and/or in case b) during readout the voltage ratios at the intermediate layer are embodied as outlined in b).

d. In both cases a) and b) during readout a variable voltage signal is applied at the gate electrode and a current or a charge change depending on the state of the shielding is measured at the readout electrode.

In the event of simple readout without additional nonvolatile modulation, the intermediate layer is grounded and an AC voltage signal is applied to the gate electrode. Depending on the shielding in the intermediate layer, a through coupling to the readout electrode takes place and for example an AC current of the charge change can be detected there.

In the case of readout with additional nonvolatile modulation of the intermediate layer, the voltage ratios at the intermediate layer remain just as they are needed in order to achieve a modulation and the AC signal is again applied to the gate electrode.

In an application of the method according to the invention to the arrangement according to the invention, i.e. the matrix, it can be provided that during readout the variable voltage signals are applied to all the word lines in parallel and a weighted multiplication takes place at the crossover points, and the currents or the charge changes in the bit line are summed. In this case, the inputs, i.e. the values of the vectors of the vector-matrix multiplication, correspond to the AC signals on the word lines and the summed results from the matrix correspond to the currents or accumulated charges of the bit lines.

In the case of a configuration in which the intermediate layer has lateral highly doped p-type and n-type zones, and the intervening region is only weakly doped or is embodied in intrinsic fashion, with formation of a lateral psn or pin zone, it can be provided that writing to the active storage medium can additionally be modulated by a symmetrical reverse or forward voltage being applied to the pin or psn junction.

By means of active depletion or enhancement of the intermediate layer with the psn or pin junctions, writing to the first dielectric can be suppressed or respectively supported by virtue of the fact that sufficient charges on the intermediate layer are necessary in order to achieve a sufficiently high field in the first dielectric layer. In the case of depletion, the field couples through principally to the readout electrode and the potential drop across the first dielectric for writing is thus lower.

With a configuration in which the component serves for modeling a sigmoid or ReLU neuron, during the dropout algorithm components are switched on or off by means of a symmetrical reverse or forward voltage (22) at the pin or psn junction.

During the training of neural networks, overfitting can occur, which is undesired. This can be reduced by some neurons being switched off during training and then being supplementarily switched step by step. The capacitive synaptic component is also fundamentally suitable for modeling a rectified linear unit (ReLU) and sigmoid neurons since the transfer function of the capacitive coupling exhibits a similar behavior. These neurons could be switched off or switched on by flooding or depletion of the intermediate layer with charge carriers.

In a further method for writing to the arrangement, either Fowler-Nordheim tunneling or injection of hot charge carriers can be used, wherein said hot charge carriers can be generated in the pin or psn junction by means of applying a voltage.

During writing to the first dielectric layer with charge traps, charge carriers can be injected into said traps either by Fowler-Nordheim tunneling or injection of hot charge carriers. The lateral psn or pin junction can also be utilized for generating hot charge carriers. In the off-state region, enough hot charge carriers can be generated given a sufficiently high reverse voltage.

BRIEF DESCRIPTION OF THE DRAWING FIGURES

The invention will be explained in greater detail below on the basis of a number of exemplary embodiments. The associated drawings show:

FIG. 1: General structure of the capacitive synaptic component with typical capacitance coupling between gate electrode and readout electrode as claimed in claims 1 and 8.

Figure 2:
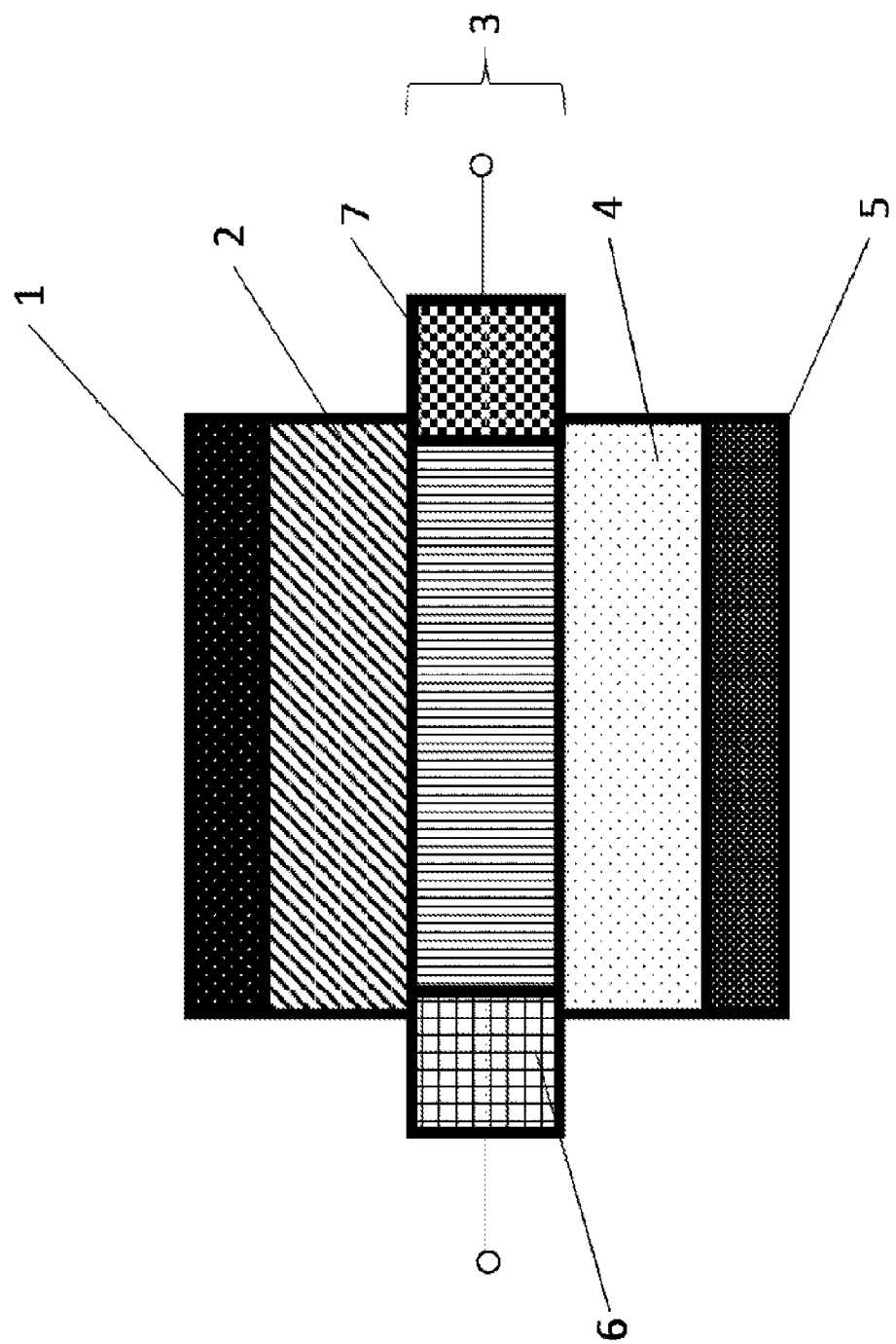

FIG. 2: Structure of a capacitive synaptic component with lateral p-doped and n-doped zones as claimed in claim 9.

Figure 3:
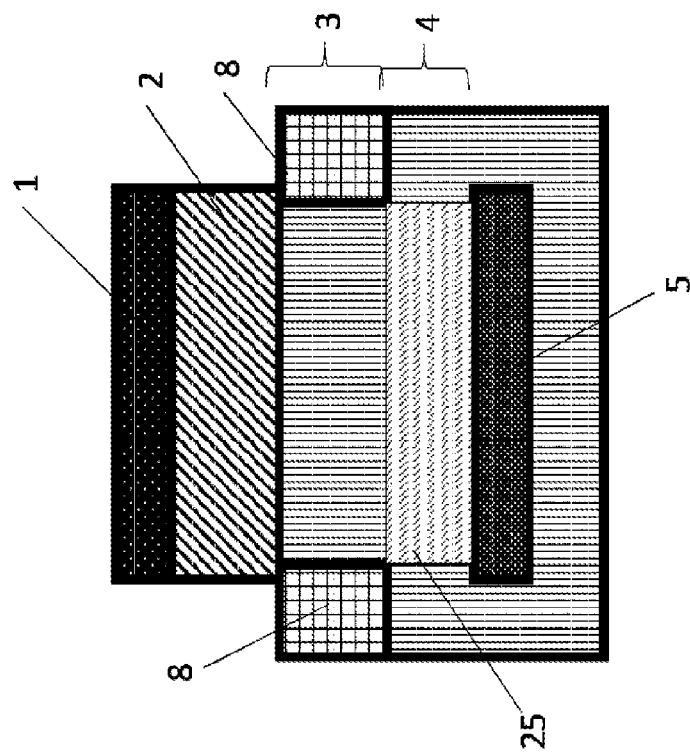
Figure 3:
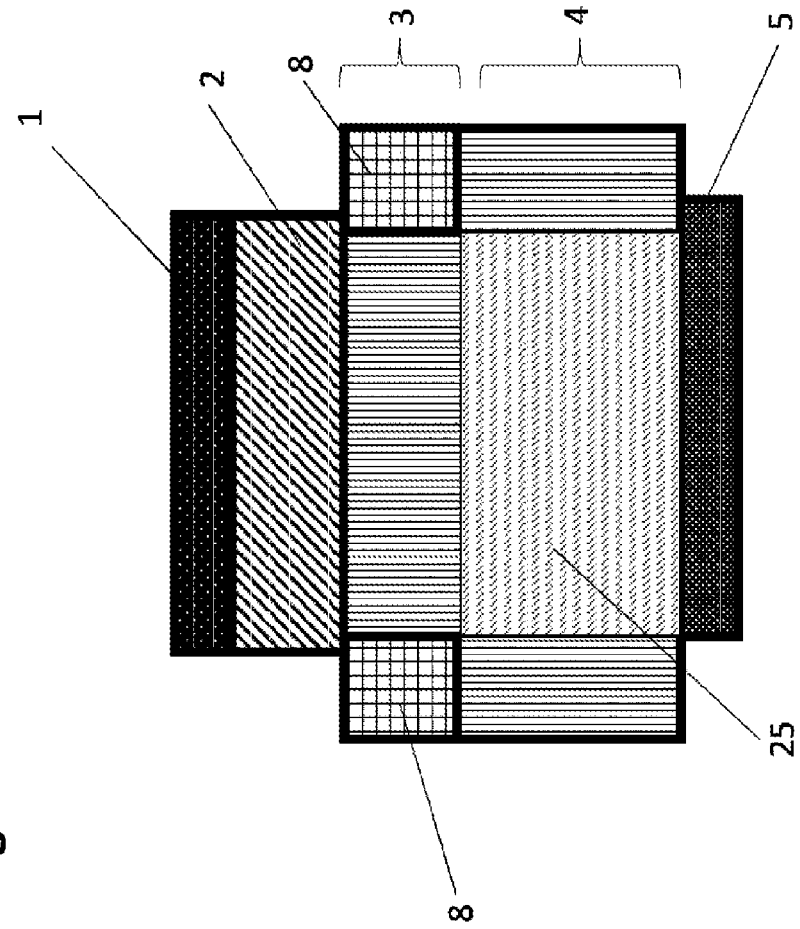

FIG. 3: Structure of a capacitive synaptic component with lateral doping and a bipartite semiconductor zone as claimed in claim 10.

Figure 4:
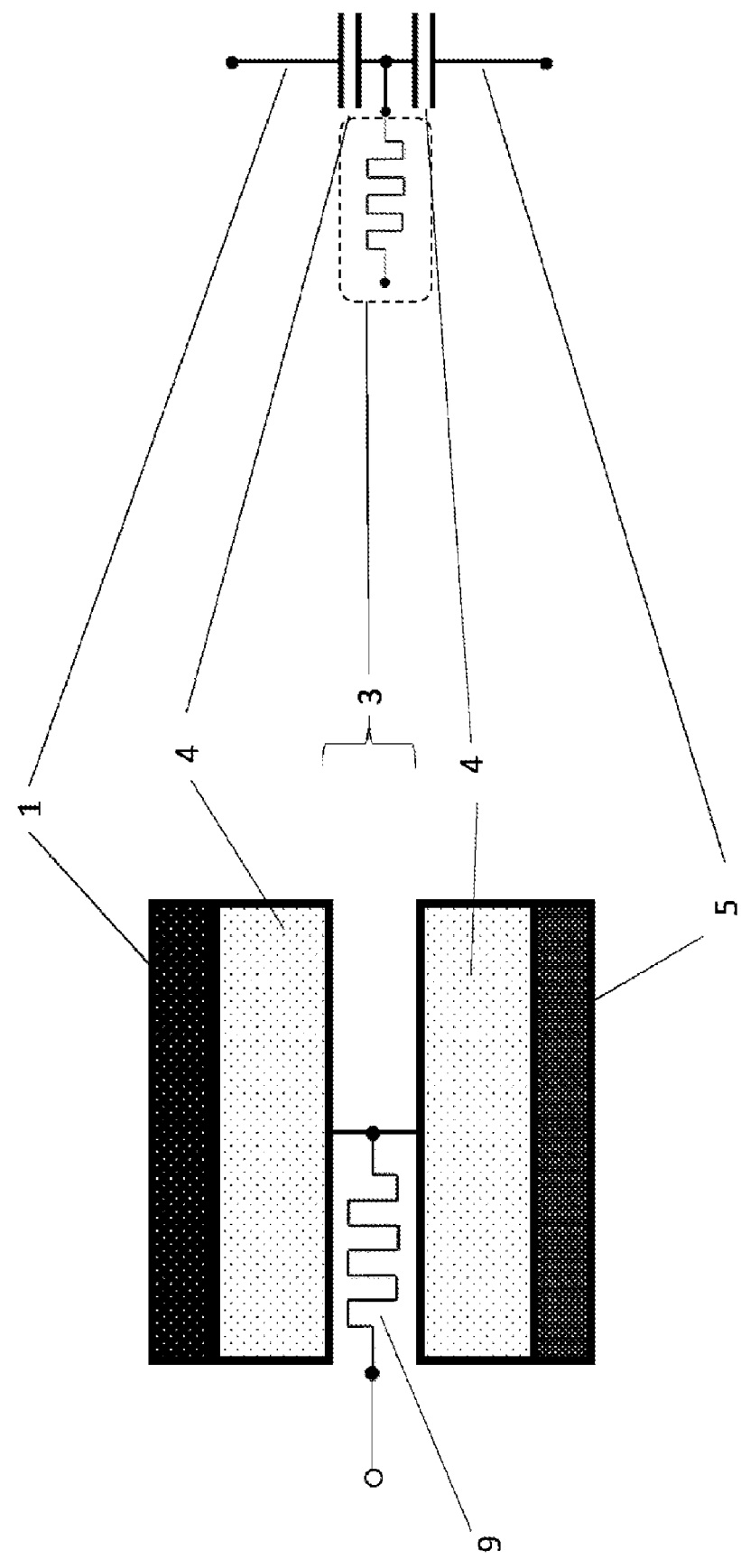

FIG. 4: Structure of a capacitive synaptic component with variable resistance as claimed in claim 6.

Figure 5:
Figure 5:
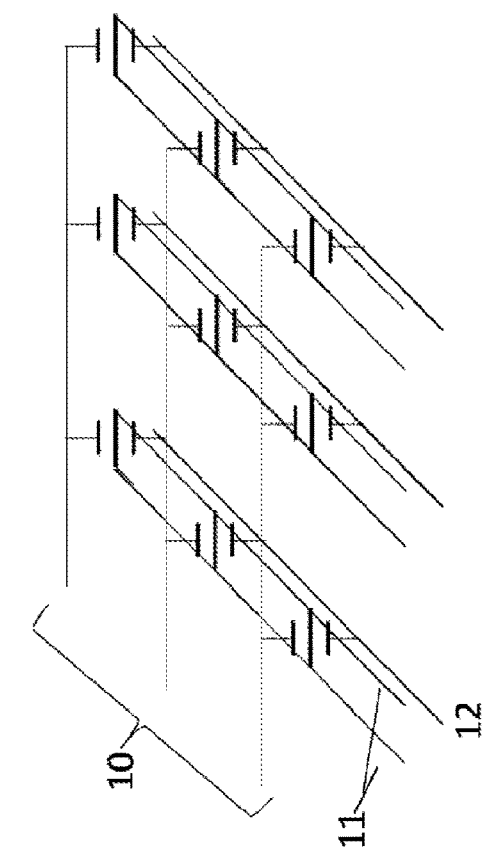
Figure 5:
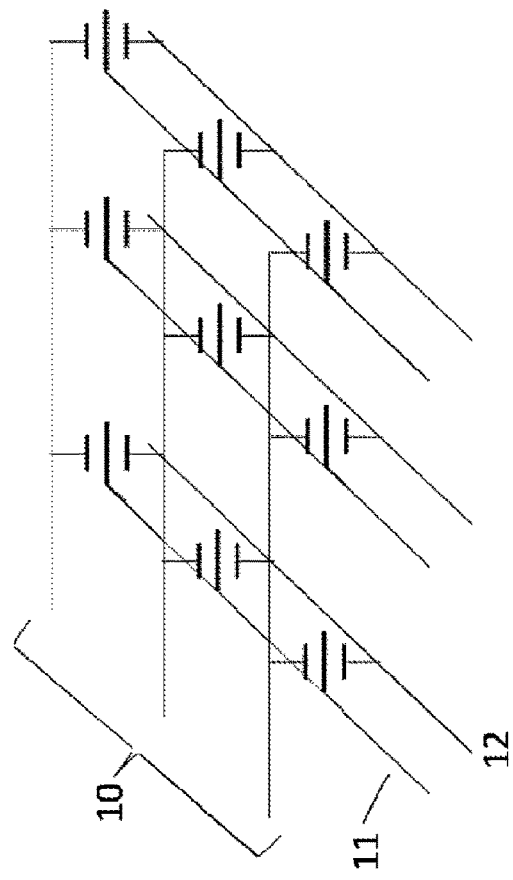

FIG. 5: Arrangement of the capacitive synaptic component in a matrix as claimed in claim 11.

Figure 6:
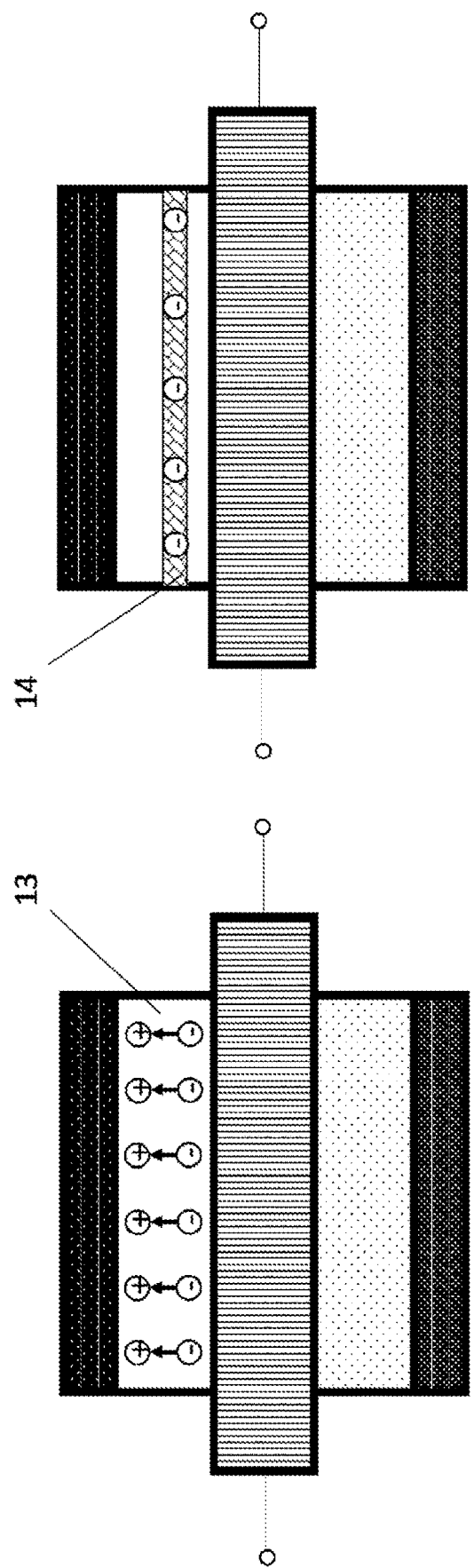

FIG. 6: Capacitive synaptic component with ferroelectric material as first dielectric layer or charge traps in the first dielectric layer as claimed in claims 4 and 5.

Figure 7:
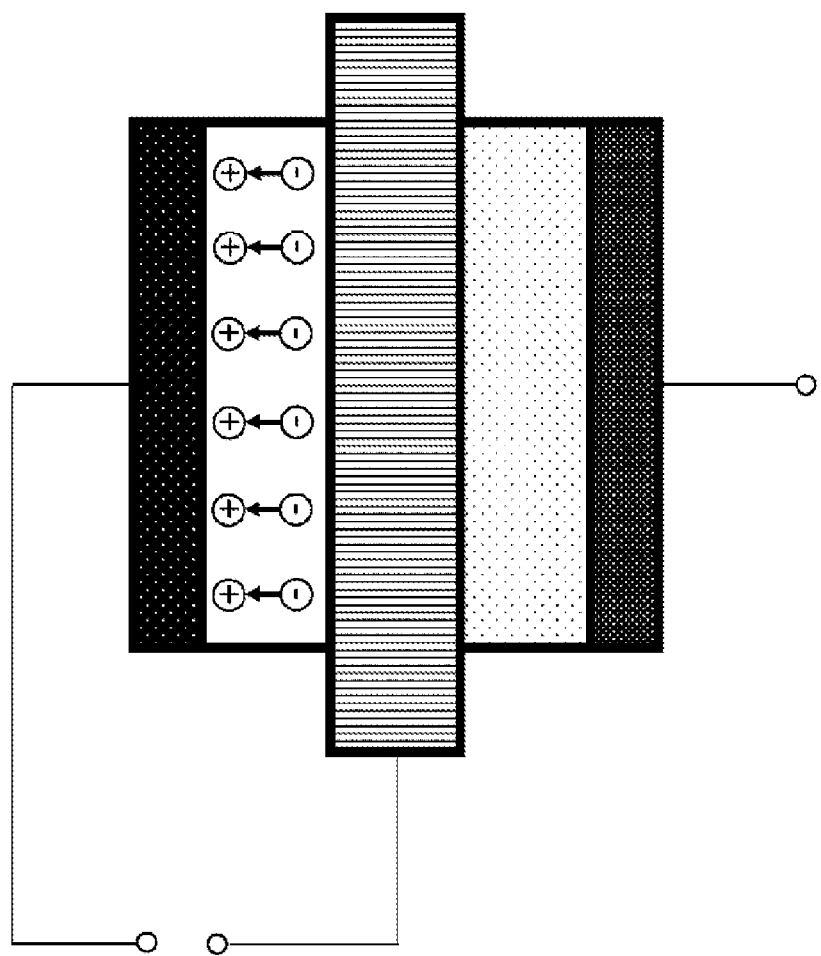
Figure 7:
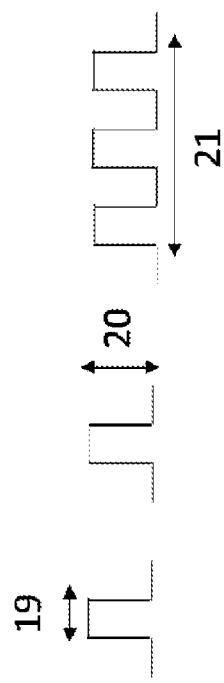

FIG. 7: Graded writing to the active storage dielectric as claimed in claim 12 with variation of the write pulse height, write pulse length or write pulse number.

Figure 8:
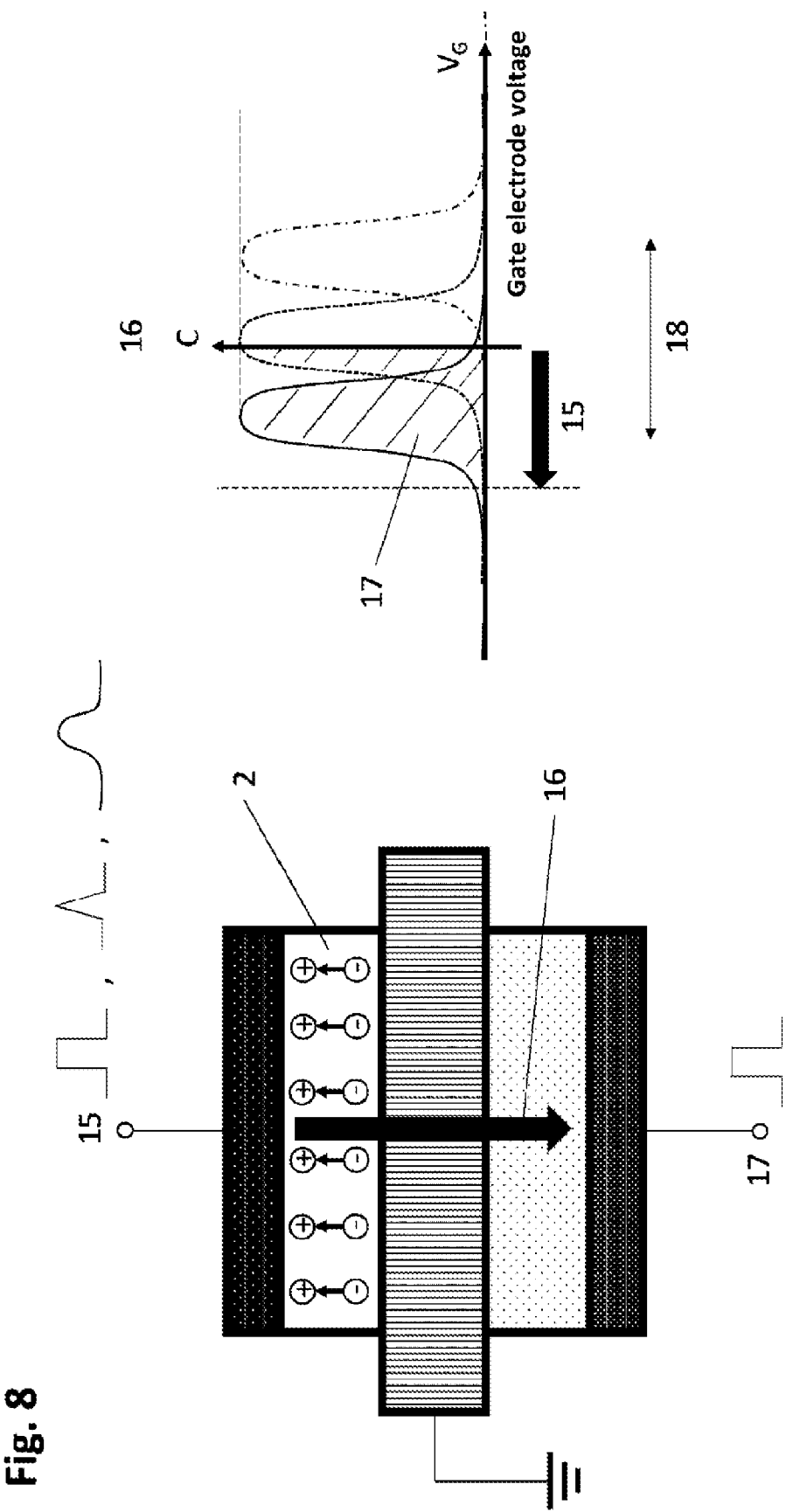

FIG. 8: Reading from the capacitive synaptic component with a variable voltage signal at the gate electrode as claimed in claim 12 and associated capacitance-voltage curves stored in a nonvolatile fashion.

Figure 9:
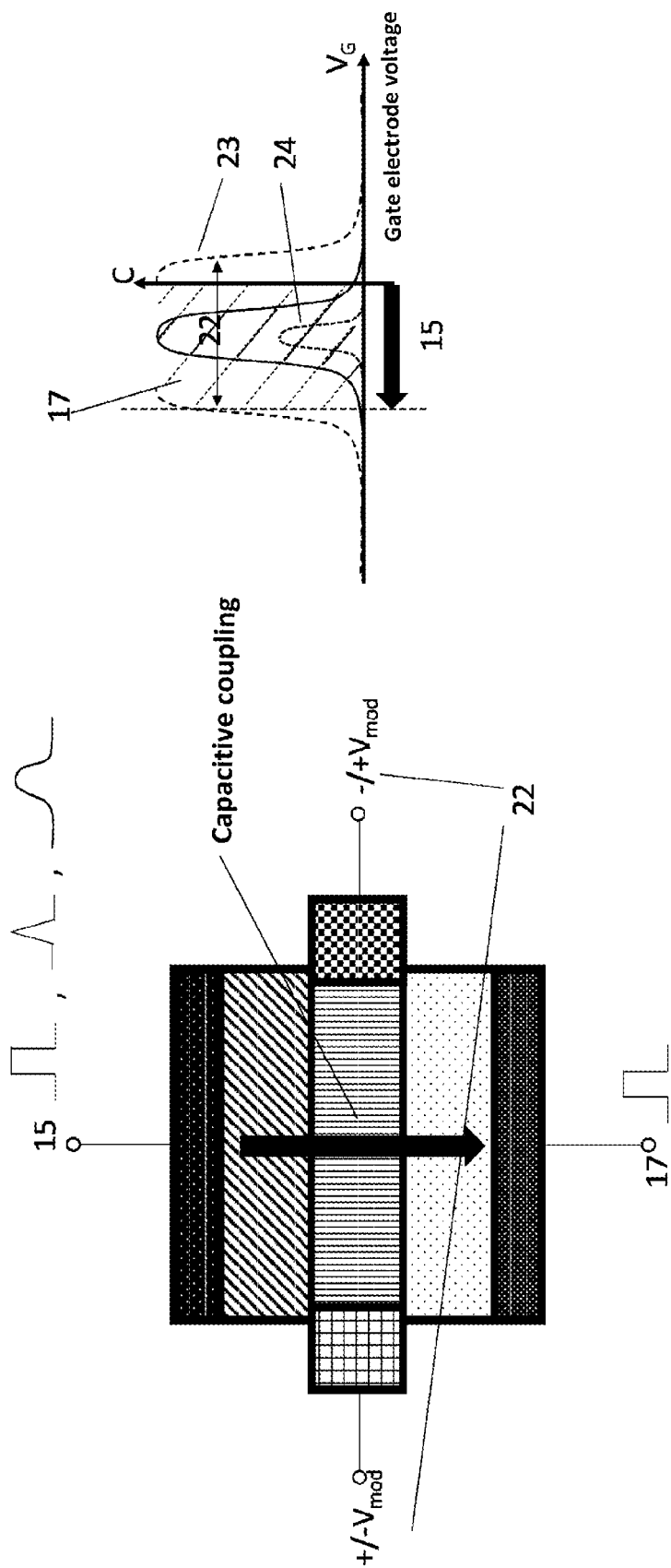

FIG. 9: Volatile adjustment of the shielding with symmetrical forward or reverse voltage at the pin junction as claimed in claim 12b, c, d (together with variable voltage signal at the gate electrode for readout) and associated capacitance-voltage curve.

Figure 10:
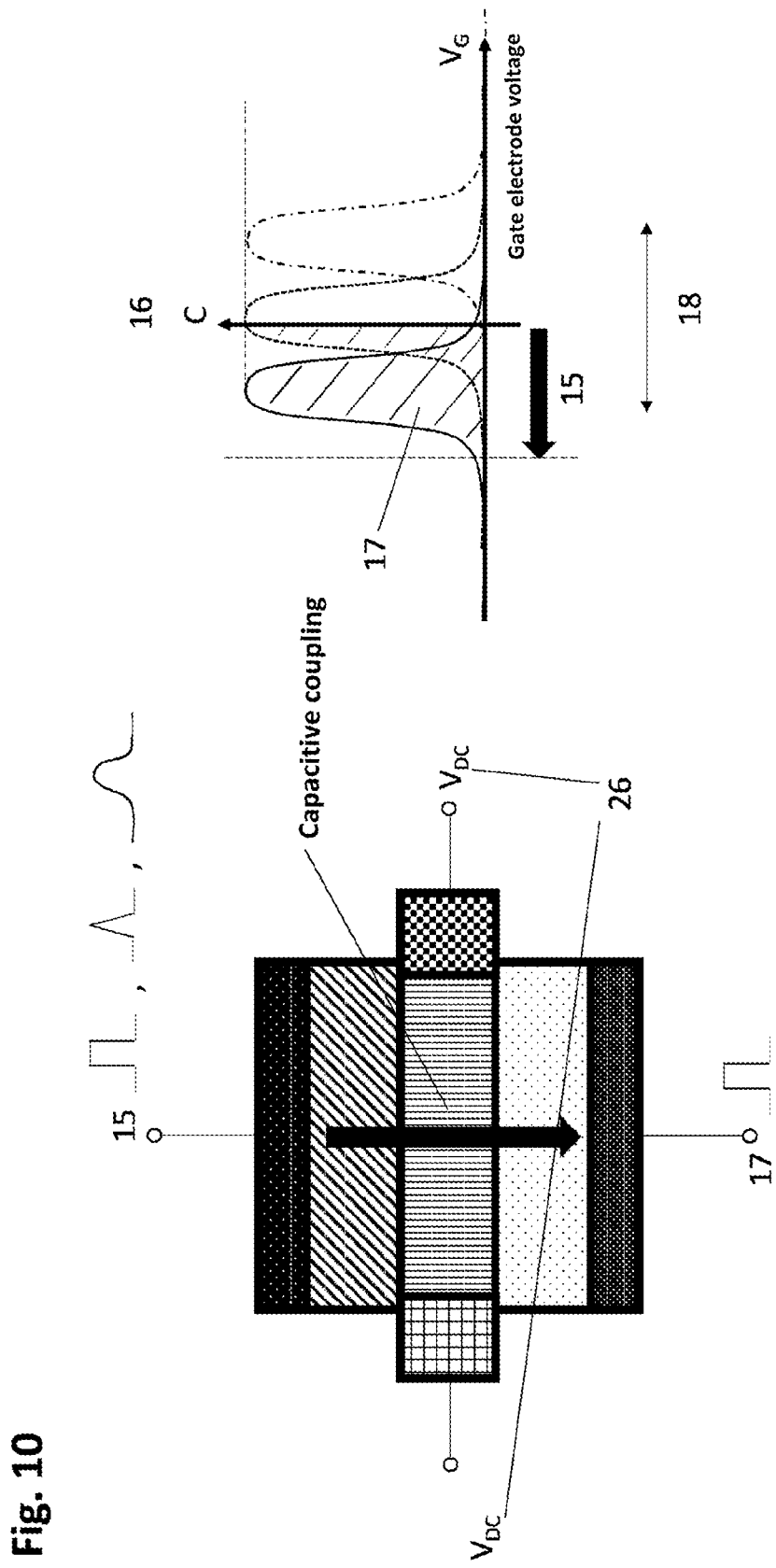

FIG. 10: Volatile adjustment of the shielding by means of DC voltage at the intermediate layer as claimed in claim 12b, c, d (together with variable voltage signal at the gate electrode for readout) and associated capacitance-voltage curve.

Figure 11:
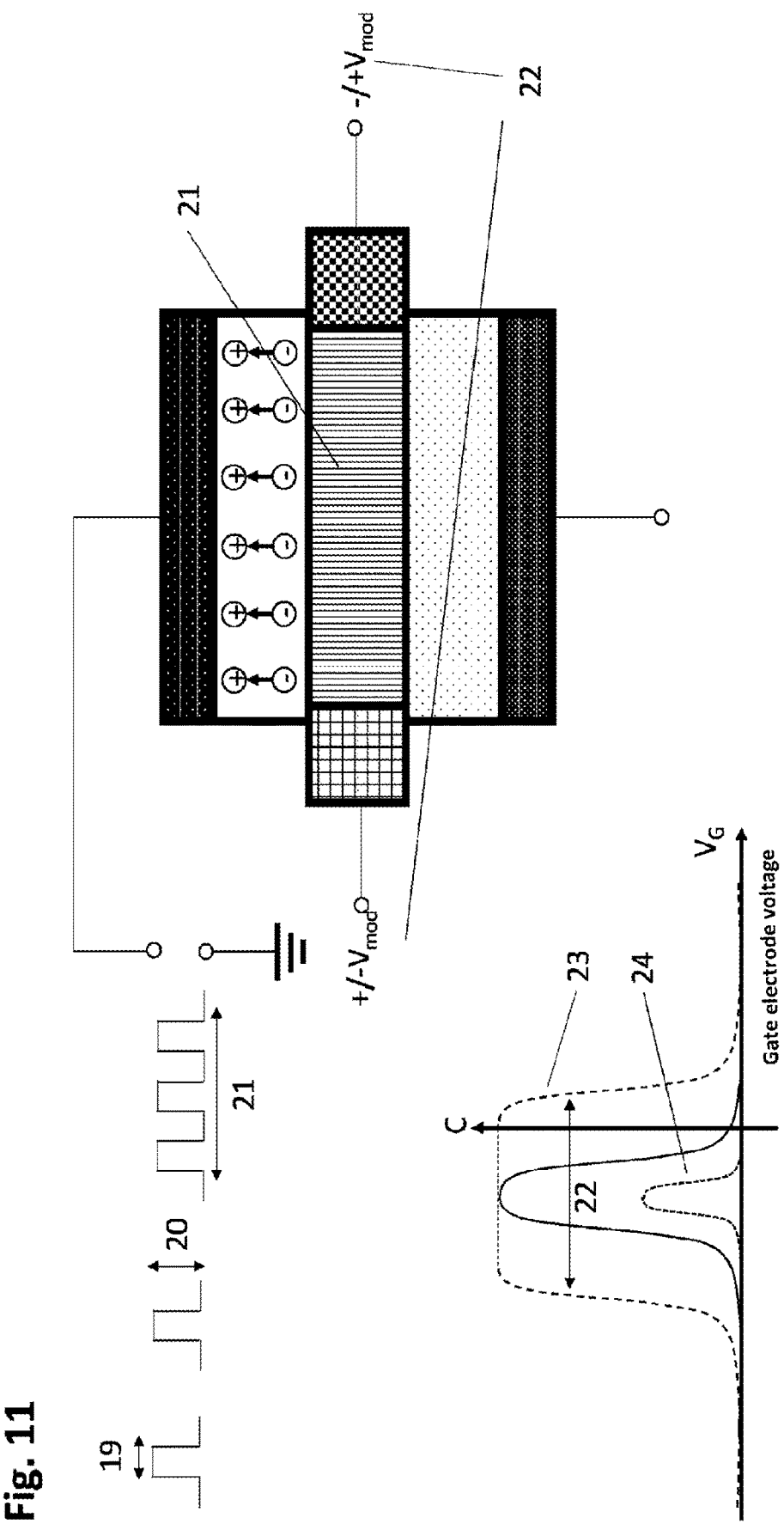

FIG. 11: Modulated writing to the active storage dielectric with a symmetrical forward or reverse voltage at the pin junction and associated capacitance-voltage curve as claimed in claim 14.

DETAILED DESCRIPTION

The intermediate layer (3) can successfully shield an electric field proceeding from the gate electrode (1) or transmit it to the bottom readout electrode (5). This transmission is accompanied by a capacitive coupling (16), wherein the swing ratio between transmission and shieling can be very large. The active storage medium ultimately adjusts the degree of coupling (16) for a specific voltage and it is intended to be capable of enabling a plurality of states to be stored in order to enable quasi analog value formation. FIG. 1 shows the general structure with gate electrode (1), first dielectric (2), intermediate layer (3) with lateral terminals, second dielectric (4) and readout electrode (5). If the intermediate layer (3) consists of a semiconductor material, the curve depicted on the right in FIG. 1 arises as capacitance-voltage curve between gate electrode and readout electrode. The semiconductor shields the electric field in the case of inversion and accumulation, and the field is transmitted in the case of full depletion. Since the inversion and accumulation layers are very thin, the semiconductor can also have a thickness of a few nanometers, and nevertheless enable a high dynamic swing ratio of the component.

FIG. 2 shows the same structure with lateral p-type (6) and n-type (7) zones, wherein the latter enable an injection of holes and electrons and thus symmetrical behavior. Moreover, an additional modulation voltage can be applied. The p-type (6) and n-type (7) zones each acquire a dedicated terminal.

As illustrated in FIG. 3, the second dielectric layer (4) can also consist of a depleted semiconductor zone (25) and thus form a continuous semiconductor zone together with the intermediate layer (3). The readout electrode (5) can be embodied as a doped zone, as depicted on the right in FIG. 3, or as a metallic zone below the semiconductor. An advantage of this arrangement would be a continuous semiconductor zone and thus simpler production.

The shielding of the intermediate layer (3) can be effected, for example, as illustrated in FIG. 4, by means of an adjustable resistance (9) of the intermediate layer. This can also be effected in a nonvolatile fashion, e.g. by means of a memristor, a metal-insulator junction or a phase-change memory. With high resistance, not enough shielding charges are supplied into the intermediate layer (3), and so low shielding is achieved.

FIG. 5 shows a matrix arrangement of a plurality of capacitive synaptic components. In this case, the word lines (10) are connected to the gate electrodes (1) and the input signals are applied. The readout electrode (5) is connected to the bit line (12) and the signals are summed on the bit lines (12). The intermediate layer (3) is connected to shielding lines (11). In the case of lateral p-type (6) and n-type (7) zones, two shielding lines (11) are present for each zone. The matrix enables an efficient implementation of a vector-matrix multiplication.

In FIG. 6, the first dielectric layer (2) forms the active storage medium. This may be a ferroelectric (13) as on the left, wherein the polarization charge represents the charge state or the first dielectric layer (2) has charge traps (14) that store the charge state.

In the event of writing (FIG. 7) to the active storage medium, a potential difference (write voltage) is generated between gate electrode (1) and intermediate layer (3). The different storage states can be adjusted by a variation of the write pulse length (19), the write pulse height (20) or the write pulse number (21). In the case of a ferroelectric (13), this is accompanied by a graded change in the polarization state or, in the case of charge traps (14), this is accompanied by varying degrees of quantum mechanical tunneling of charge carriers of the intermediate layer (3).

After writing, the nonlinear capacitance-voltage curves (16), as illustrated on the right in FIG. 8, are shifted (18). In the event of readout, a variable voltage signal (15) is applied to the gate electrode (1), while the intermediate layer (3) can be grounded. In this case, a current or a charge change (17) that depends on the shielding of the intermediate layer (3) is measured at the readout electrode (5). In this case, the charge quantity (17) is proportional to the area beneath the capacitance-voltage curve (16) that is sampled by the variable voltage signal (15) at the gate electrode (1). In the case of the capacitance-voltage curve shifted toward the right by way of example in FIG. 8, the charge change (17) would be very small.

It is likewise possible, as illustrated in FIG. 9, to vary the capacitive coupling in a volatile fashion by means of a symmetrical reverse or forward voltage (22) at the pin or psn junctions. In this case, the intermediate layer (3) is depleted or flooded with mobile charge carriers. The corresponding capacitance-voltage curves are illustrated on the right in FIG. 9 and, for the case of depletion, the curves become wider (23) and, in the case of flooding, the curves become narrower and lower (24) and can also be completely switched off. In the case of depletion, the variable voltage signal (15) applied during readout at the gate electrode (1) provides for a large charge change (17) at the readout electrode (5).

The shift of the capacitance-voltage curves can be achieved not only by means of charge states in the dielectric (FIG. 8), but also in a volatile fashion by means of a DC voltage (26) at the intermediate layer (3), as illustrated in FIG. 10. The readout is then also effected by means of a variable voltage signal (15) at the gate electrode (1) and the measured charge change (17) at the readout electrode (5).

Writing to the active storage medium can also be modulated by a forward or reverse voltage (22) being applied to the lateral pin junctions in the intermediate layer (3), as illustrated in FIG. 11. In the case of charge carrier depletion in the intermediate layer, it is not possible to supply sufficient charge carriers to ensure a sufficiently high electric field in the first dielectric layer (2) for writing. The field couples through principally to the readout electrode (5) and the voltage drop across the first dielectric layer (2) is too low or reduced. The picture is opposite in the case of charge carrier flooding. Writing to the capacitive synaptic component can additionally be modulated in this way.

LIST OF REFERENCE SIGNS

1—Gate electrode
2—First dielectric layer
3—Intermediate layer
4—Second dielectric layer
5—Readout electrode
6—p-doped zone
7—n-doped zone
8—Doped zone
9—Variable resistance that can store its resistance value in a nonvolatile fashion
10—Word lines
11—Shielding lines
12—Bit lines
13—Ferroelectric material
14—Charge traps
15—Variable voltage signal
16—Capacitive coupling between gate electrode and readout electrode
17—Current or charge change
18—Shift of the capacitive coupling
19—Write pulse duration
20—Write pulse height
21—Write pulse number
22—Symmetrical reverse or forward voltage
23—Reverse direction
24—Forward direction
25—Second partial region of the semiconductor, which has charge carrier depletion
26—DC voltage

The invention claimed is:

1. A capacitive synaptic component, namely a capacitive component for weighted multiplication in artificial neural networks, consisting of a layer structure with a gate electrode, comprising: a first dielectric layer connected to the gate electrode; a second dielectric layer; a readout electrode connected to the second dielectric layer; and an intermediate layer arranged between the first dielectric layer and the second dielectric layer; wherein (i) the intermediate layer is embodied as a layer having adjustable shielding behavior in an electric field, the electric field proceeding from the gate electrode in the direction toward the readout electrode, and (ii) the intermediate layer is provided with one or more dedicated contacts that cause/provide a flow into or a flow out of the intermediate layer.

2. The capacitive synaptic component as claimed in claim 1, wherein the first dielectric layer and/or the intermediate layer are/is embodied as an active storage medium.

3. The capacitive synaptic component as claimed in claim 2, wherein the first dielectric layer is embodied as an active storage medium storing different charge states.

4. The capacitive synaptic component as claimed in claim 3, wherein the first dielectric layer consists of a ferroelectric material.

5. The capacitive synaptic component as claimed in claim 3, wherein the first dielectric layer has charge traps.

6. The capacitive synaptic component as claimed in claim 2, wherein the intermediate layer is embodied as an active storage medium storing different resistance values by virtue of the fact that the intermediate layer has a variable resistance, and it is embodied so as to store its resistance value in a nonvolatile manner.

7. The capacitive synaptic component as claimed in claim 6, wherein the intermediate layer consists of a metal-insulator junction material, a memristive material or a phase-change memory.

8. The capacitive synaptic component as claimed in claim 1, wherein the intermediate layer consists of a semiconductor material and has a nonlinearity in a capacitance-voltage ratio of a capacitive coupling between gate electrode and readout electrode.

9. The capacitive synaptic component as claimed in claim 8, wherein the intermediate layer has lateral highly doped p-type and n-type zones, and the intervening region is only weakly doped or is embodied in intrinsic fashion, with formation of a lateral psn or pin zone.

10. The capacitive synaptic component as claimed in claim 8, wherein there is arranged between the first dielectric layer and the readout electrode a semiconductor region having a first partial region, which forms the intermediate layer, and a second partial region, which is provided with a charge carrier depletion, such that it forms the second dielectric layer.

11. The capacitive synaptic component as claimed in claim 1, further comprising a matrix comprising a plurality of said capacitive synaptic components in which, from each capacitive synaptic component, the word line is connected to the gate electrode, the readout electrode is connected to the bit line and the intermediate layer is connected to a shielding line, wherein, in the case of laterally doped zones, shielding lines are present for each doped zone, wherein the shielding line is embodied in a manner corresponding to the bit line, and the bit lines form an angle of not equal to zero, preferably 90°, with respect to the word lines.

12. A method for writing to and reading from a capacitive synaptic component as claimed in claim 1, comprising:
   a. in the event of a nonvolatile adjustment of the shielding, applying a write voltage between the gate electrode and the intermediate layer and wherein it is possible to achieve graded writing in the form of the adjustment of different electrical states of the active storage medium either by way of a varying write pulse height, write pulse duration or write pulse number,
   b. in the event of a volatile adjustment of the shielding on a case by case basis at the intermediate layer, applying a DC voltage or a symmetrical reverse or forward voltage to a pin or psn junction, and
   c. in case a) the intermediate layer is grounded during readout of the capacitive coupling between gate electrode and readout electrode, and/or in case b) during readout the voltage ratios at the intermediate layer are embodied as outlined in b), and
   d. in both cases a) and b) during readout a variable voltage signal is applied at the gate electrode and a current or a charge change depending on the state of the shielding is measured at the readout electrode.

13. The method as claimed in claim 12, wherein during readout the variable voltage signals are applied to all the word lines in parallel and a weighted multiplication takes place at the crossover points, and the currents or the charge changes in the bit line are summed.

14. The method as claimed in claim 12, wherein writing to the active storage medium can additionally be modulated by a symmetrical reverse or forward voltage being applied to the pin or psn junction.

15. The method as claimed in claim 12, wherein the component serves for modelling a sigmoid or ReLU neuron, and wherein during a dropout algorithm components can be switched on or off by means of symmetrical reverse or forward voltage at the pin or psn junction.

16. The method for writing to the arrangement as claimed in claim 12, wherein during writing either Fowler-Nordheim tunnelling or injection of hot charge carriers can be used, wherein said hot charge carriers can be generated in the pin or psn junction by means of applying a voltage.

17. The capacitive synaptic component as claimed in claim 6, wherein the intermediate layer consists of a semiconductor material and has a nonlinearity in a capacitance-voltage ratio of a capacitive coupling between gate electrode and readout electrode.

18. The capacitive synaptic component as claimed in claim 10, further comprising a matrix comprising a plurality of said capacitive synaptic components in which, from each capacitive synaptic component, the word line is connected to the gate electrode, the readout electrode is connected to the bit line and the intermediate layer is connected to a shielding line, wherein, in the case of laterally doped zones, shielding lines are present for each doped zone, wherein the shielding line is embodied in a manner corresponding to the bit line, and the bit lines form an angle of not equal to zero, preferably 90°, with respect to the word lines.

19. The capacitive synaptic component as claimed in claim 2, further comprising a matrix comprising a plurality of said capacitive synaptic components in which, from each capacitive synaptic component, the word line is connected to the gate electrode, the readout electrode is connected to the bit line and the intermediate layer is connected to a shielding line, wherein, in the case of laterally doped zones, shielding lines are present for each doped zone, wherein the shielding line is embodied in a manner corresponding to the bit line, and the bit lines form an angle of not equal to zero, preferably 90°, with respect to the word lines.

20. The capacitive synaptic component as claimed in claim 6, further comprising a matrix comprising a plurality of said capacitive synaptic components in which, from each capacitive synaptic component, the word line is connected to the gate electrode, the readout electrode is connected to the bit line and the intermediate layer is connected to a shielding line, wherein, in the case of laterally doped zones, shielding lines are present for each doped zone, wherein the shielding line is embodied in a manner corresponding to the bit line, and the bit lines form an angle of not equal to zero, preferably 90°, with respect to the word lines.

* * * * *